United States Patent
Kasano et al.

(10) Patent No.: US 7,750,354 B2
(45) Date of Patent: Jul. 6, 2010

(54) SOLID-STATE IMAGING DEVICE AND MANUFACTURING METHOD FOR THE SAME

(75) Inventors: Masahiro Kasano, Takatsuki (JP); Yuichi Inaba, Moriguchi (JP); Takumi Yamaguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/187,720

(22) Filed: Aug. 7, 2008

(65) Prior Publication Data

US 2008/0303108 A1 Dec. 11, 2008

Related U.S. Application Data

(62) Division of application No. 11/330,396, filed on Jan. 12, 2006, now Pat. No. 7,416,915.

(30) Foreign Application Priority Data

Jan. 17, 2005 (JP) ............................ 2005-009619

(51) Int. Cl.
*H01L 29/20* (2006.01)

(52) U.S. Cl. .......................................... 257/89; 257/98

(58) Field of Classification Search .............. 257/184, 257/432

See application file for complete search history.

(56) References Cited

U.S. PATENT DOCUMENTS

| | | | | |
|---|---|---|---|---|
| 4,538,884 A | * | 9/1985 | Masaki | 349/28 |
| 5,294,288 A | | 3/1994 | Melpolder et al. | |
| 5,661,531 A | * | 8/1997 | Greene et al. | 349/73 |
| 5,672,537 A | | 9/1997 | Carl et al. | |
| 5,916,714 A | * | 6/1999 | Sato et al. | 430/7 |
| 6,064,069 A | | 5/2000 | Nakano et al. | |
| 6,661,458 B1 | * | 12/2003 | Takada et al. | 348/273 |
| 6,960,799 B2 | | 11/2005 | Descure | |
| 2002/0012856 A1 | | 1/2002 | Ohtsu et al. | |
| 2002/0090494 A1 | | 7/2002 | Song | |
| 2004/0234417 A1 | | 11/2004 | Schienle et al. | |
| 2005/0103983 A1 | | 5/2005 | Yamaguchi et al. | |

(Continued)

FOREIGN PATENT DOCUMENTS

JP 57-194694 11/1982

(Continued)

OTHER PUBLICATIONS

Ando, T., et al. "Introduction to Solid-state Imaging Devices- The Workings of an Electronic Eye" 1999, pp. 183-247.

(Continued)

*Primary Examiner*—Wai-Sing Louie
*Assistant Examiner*—Bilkis Jahan
(74) *Attorney, Agent, or Firm*—McDermott Will & Emery LLP

(57) ABSTRACT

Photoelectric converters are arranged two-dimensionally in a semiconductor substrate. A planarizing layer, a light shielding film, a further planarizing layer and condenser lenses are formed sequentially on the semiconductor substrate and the photoelectric converters. The light shielding film has apertures at positions corresponding to the photoelectric conversion devices. Multilayer interference filters that transmit either a red, green or blue wavelength component of light are disposed in the apertures.

2 Claims, 12 Drawing Sheets

U.S. PATENT DOCUMENTS

2005/0134788 A1* 6/2005 Park .......................... 349/158
2005/0151909 A1* 7/2005 Yagi et al. ................... 349/138

FOREIGN PATENT DOCUMENTS

| JP | 63-36203 | 2/1988 |
|---|---|---|
| JP | 2-84766 | 3/1990 |
| JP | 6-163863 | 6/1994 |
| JP | 07-043517 | 2/1995 |

OTHER PUBLICATIONS

Japanese Office Action issued in Japanese Patent Application No. 2005-009619, issued on Mar. 16, 2010.

* cited by examiner

SOLID-STATE IMAGING DEVICE AND MANUFACTURING METHOD FOR THE SAME

This application is a Divisional of U.S. application Ser. No. 11/330,396, filed Jan. 12, 2006, now U.S. Pat. No. 7,416,915 and is based on application No. 2005-009619 filed in Japan on Jan. 17, 2005, the entire contents of each of which are hereby incorporated by reference.

BACKGROUND OF INVENTION

1. Field of the Invention

The present invention relates to a solid-state imaging device and manufacturing method for the same, and in particular to a technique for preventing color-mixing that occurs as a result of light which has passed through a color filter being incident on the wrong light receiving device.

2. Related Art

Solid-state imaging devices, which are essentially the heart of digital cameras that have become widely used in recent years, take color images by using color filters to separate incident light into its constituent colors. FIG. 1 is a cross-sectional view showing a structure of a solid-state imaging device according to conventional technology.

As shown in FIG. 1, a solid-state imaging device 11 includes a semiconductor substrate 1101 which has photoelectric converters 1102 formed therein. A planarizing layer 1103, a light shielding film 1104, a planarizing layer 1105, color filters 1106, a planarizing layer 1107 and condenser lenses 1108 are sequentially formed on the semiconductor substrate 1101 and the photoelectric converters 1102.

Apertures 1104a are provided in the light shielding film 1104 such that incident light can reach the photoelectric converters 1102. The color filters 1106 transmit only specific wavelengths of light as a result of including organic pigment microparticles. Each color filter 1106 transmits red, green or blue light per pixel ("Introduction to Solid-State Imaging Devices", Ando and Komobuchi, Ed. Eizo Joho Media Gakkai, Nihon Riko Shuppankai, 1999, pp. 183-188).

However, given that the color filters 1106 pertaining to conventional technology have film thicknesses of from 1.5 µm to 2.0 µm, incident light may travel an oblique path depending on an angle of incidence and be incident on the wrong photoelectric converter 1102, whereby color-mixing occurs. In other words, light that passes through a given color filter is incident on a photoelectric converter that does not correspond to the given color filter, whereby an incorrect quantity of incident light is detected.

In regard to this problem, the film thicknesses of the color filters 1106 may be reduced. By reducing the film thicknesses of the color filters 1106, incident light will not travel an oblique path unless the angle of incidence is extremely large.

However, there is a limit to this miniaturization since the pigment particles which constitute the color filters 1106 have a particle diameter of 0.1 µm. For this reason, as the film thicknesses of the color filters 1106 are excessively reduced, the distribution of pigment particles ceases to be uniform, sensitivity reduction and color irregularities occurs, and the color filters become impractical for use.

A technique for forming a color filter directly on the light shielding layer has also been proposed (Japanese Patent Application Publication No. 7-43517). FIG. 2 is a cross-sectional view showing a structure of a solid-state imaging device according to this conventional technique.

In FIG. 2, a solid-state imaging device 12 includes CCDs 1201, photodiodes 1202, pigmentation layers (color filters) 1203 and a light shielding film layer 1204, with a planarizing resin layer 1205 on the CCDs and photodiodes. However, even with this structure it is not possible to prevent color-mixing since the color filters remain thick enough to allow oblique light.

SUMMARY OF INVENTION

In view of the above issue, an object of the present invention is to provide a small solid-state imaging device in which color-mixing due to oblique light does not occur, and a manufacturing method for the same.

To achieve the above object, the solid-state imaging device of the present invention includes a color filter that is composed of an inorganic material and operable to transmit a specific wavelength component of incident light; a light shielding film operable to shield incident light; and a photoelectric converter operable to generate an electrical signal according to a quantity of light transmitted by the color filter, the light shielding film having an aperture at a position opposing the photoelectric converter, and the color filter being disposed in the aperture of the light shielding film.

It is possible to reduce a thickness of the solid-state imaging device if the color filter composed of inorganic material (hereinafter, "inorganic filter") is disposed in the aperture of the light shielding film. It is also possible to eliminate color-mixing due to oblique light since the distance between the color filter and the photoelectric converter is reduced, as can the distance between the color filter and a lens which focuses incident light onto the photoelectric converter.

Also, a film thickness of an inorganic filter can be reduced more easily than an organic filter, and color-mixing attributable to the reduction in film thickness can be prevented. An inorganic filter is also more heat resistant and light resistant than an organic filter. Furthermore, if an inorganic material is used, the inorganic filter can be manufactured in the same semiconductor process as the photoelectric converter, a wiring, etc., thereby simplifying the manufacturing process and reducing cost compared with an organic filter which requires a purpose-built manufacturing line.

In this case, the color filter may be a single-layer filter or a multilayer interference filter.

Also, in the solid-state imaging device pertaining to the present invention, a film thickness of the multilayer interference filter may be less than or equal to a film thickness of the light shielding film, a planarizing layer may be laminated on the multilayer interference filter if the film thickness of the multilayer interference filter is less than the film thickness of the light shielding film, and a combined film thickness of the multilayer interference filter and the planarizing layer may be substantially equal to the film thickness of the light shielding film.

According to this structure, it is possible to prevent color-mixing due to oblique light since a distance between the photoelectric converter and the condenser lens which focuses incident light onto the photoelectric converter can be reduced. Particularly, if a maximum film thickness of the multilayer interference filter is substantially equal to the film thickness of the light shielding film, the device is even more effective because oblique light can be prevented while minimizing the film thickness of the light shielding film.

In the solid-state imaging device pertaining to the present invention, a condenser lens may be formed on the multilayer interference filter, or on the planarizing layer if the planarizing layer is laminated on the multilayer interference filter. According to this structure, the distance between the multilayer interference filter and the condenser lens is shortened, allowing the overall thickness of the solid-state imaging device to be reduced, while enabling the elimination of color-mixing resulting from oblique light.

In the solid-state imaging device pertaining to the present invention, the multilayer interference filter may be composed of a pair of λ/4 multilayer films and a spacer layer sandwiched therebetween, each multilayer film being constituted from two types of alternately laminated dielectric layers that are of different materials and have a same optical thickness, and the spacer layer having a different optical thickness from the dielectric layers constituting the λ/4 multilayer films; and the dielectric layers that constitute the λ/4 multilayer films may consist of two materials selected from the group consisting of monosilicon dioxide, monotitanium dioxide, ditantalum pentoxide, monozirconium dioxide, monosilicon mononitride, trisilicon tetranitride, dialuminum trioxide, monomagnesium difluoride, monohafnium trioxide and monomagnesium dioxide. According to this structure, it is possible to realize a multilayer interference filter using an inorganic material. Conventionally, organic materials used in color filters are insufficient in terms of light resistance and heat resistance, although this problem can be solved if an inorganic material is used.

The multilayer interference filter is constituted from λ/4 multilayer films that are formed by alternately laminating high refractive index and low refractive index materials. The greater the difference in refractive index between the materials, the larger the reflection band can be made. In general, high refractive index materials have a large absorption coefficient at short wavelengths, reducing the sensitivity of the solid-state imaging device.

In regard to this problem, if the dielectric layers that constitute the λ/4 multilayer films consist of monosilicon dioxide and monotitanium dioxide, the problem of reduced sensitivity of the solid-state imaging device can be resolved since monotitanium dioxide, which has a high refractive index and almost no absorption at short wavelengths, is used. Monosilicon dioxide is suitable as a low refractive index material since it is widely used in semiconductor processes.

The manufacturing method of a solid-state imaging device pertaining to the present invention includes a first step of forming a multilayer interference filter over a semiconductor substrate having photoelectric converters arranged two-dimensionally; a second step of forming a groove by removing the multilayer interference filter except for portions opposing the photoelectric converters; and a third step of forming a light shielding film in the groove. Generally, it is desirable to have the vast majority of incident light be incident on the multilayer interference filter in a laminate direction since multilayer interference filters only function to separate colors in the laminate direction.

When the multilayer interference filter is disposed in the aperture of the light shielding film, as in the present invention, forming the light shielding film after formation of the multilayer interference filter allows the amount of light that is incident on the multilayer interference filter in the laminate direction to be maximized. Consequently, sensitivity of the solid-state imaging device can be improved.

In this case, the third step may include, for example, a fourth step of laminating a light shielding material on the remaining portion of the multilayer interference filter and the groove; a fifth step of forming, on the laminated light shielding material, a resist over the groove; a sixth step of removing the laminated light shielding material; and a seventh step of removing the resist. Also, if the third step includes an eighth step of laminating a light shielding material on a remaining portion of the multilayer interference filter and the groove, and a ninth step of removing the light shielding material laminated on the multilayer interference filter by oblique etching relative to a wafer surface, portions of the laminated light shielding material which are to become the light shielding film are not etched due to being blocked by the multilayer interference filter. Consequently, the light shielding film can be formed without formation of a resist, thereby enabling simplification of the manufacturing process of the solid-state imaging device and a reduction in manufacturing cost. Note that the light shielding material may be a metal.

A manufacturing method for a solid-state imaging device pertaining to the present invention includes a first step of forming multilayer interference filters on a semiconductor substrate having photoelectric converters arranged two-dimensionally, the multilayer interference filters having different film thicknesses depending on a wavelength of light to be transmitted; a second step of forming an insulation film on the multilayer interference filters, the insulation film having a film thickness greater than or equal to a difference in film thickness between the multilayer interference filters; a third step of forming grooves by removing the insulation film and the multilayer interference filters except for portions opposing the photoelectric converters; a fourth step of laminating a light shielding material on the insulation film and the semiconductor substrate; and a fifth step of polishing the laminated light shielding material and the insulation film until a thickest portion of the multilayer interference filters is exposed. A plurality of wafers can be polished simultaneously if a chemical mechanical polishing method is used, thereby enabling more efficient manufacturing of the solid-state imaging device compared to using an etching process in which each wafer must be processed individually.

Also, a condenser lens can be attached without providing a planarizing layer on the multilayer interference filter since an upper surface of the multilayer interference filter is already planarized. Consequently, the manufacturing process is simplified, and manufacturing cost can be reduced. Note that the laminated light shielding material and the insulation film may be polished using a chemical mechanical polishing method.

Also, if the light shielding material is one of tungsten and copper, tungsten and copper are widely used in CMP (Chemical Mechanical Polishing), and therefore are suitable as metallic materials to be polished.

As mentioned above, the multilayer interference filter is disposed in the aperture of the light shielding film in the present invention, thereby enabling the thickness of the solid-state imaging device to be reduced 2 μm more than conventional technology. Consequently, it is possible to prevent color-mixing due to an increasing number of pixels, etc.

BRIEF DESCRIPTION OF DRAWINGS

These and other objects, advantages, and features of the invention will become apparent from the following description thereof taken in conjunction with the accompanying drawings, which illustrate a specific embodiment of the present invention.

In the drawings:

FIG. 4 are cross-sectional views showing a layer structure of multilayer interference filters 107r, 107g and 107b according to embodiment 1, where

DETAILED DESCRIPTION OF PREFERRED EMBODIMENTS

An embodiment of a solid-state imaging device and a manufacturing method for the same pertaining to the present invention is described below with reference to the drawings.

Embodiment 1

(1) Structure of the Solid-State Imaging Device

Figure 1:
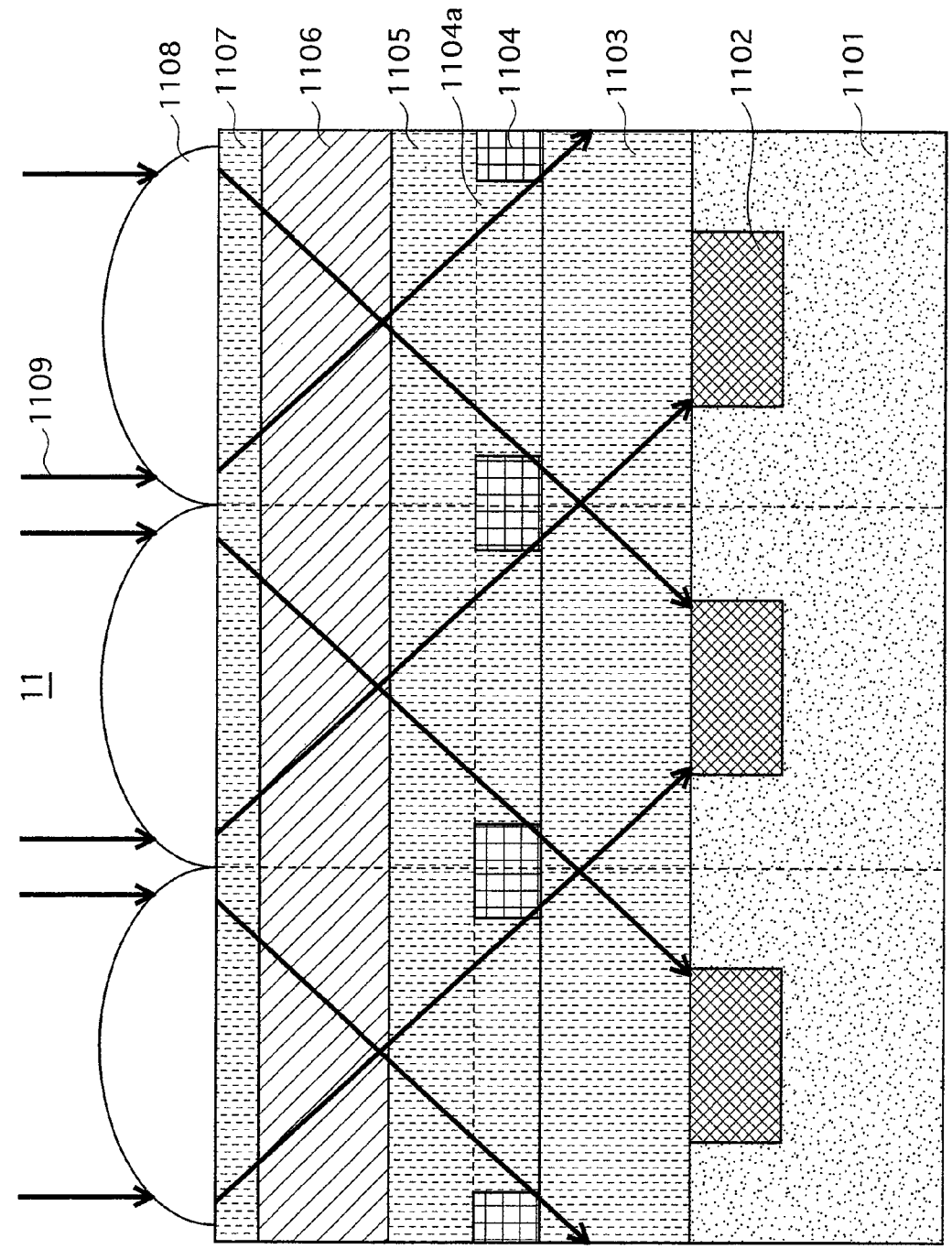
FIG. 1 is a cross-sectional view showing a structure of a solid-state imaging device according to conventional technology.
Figure 2:
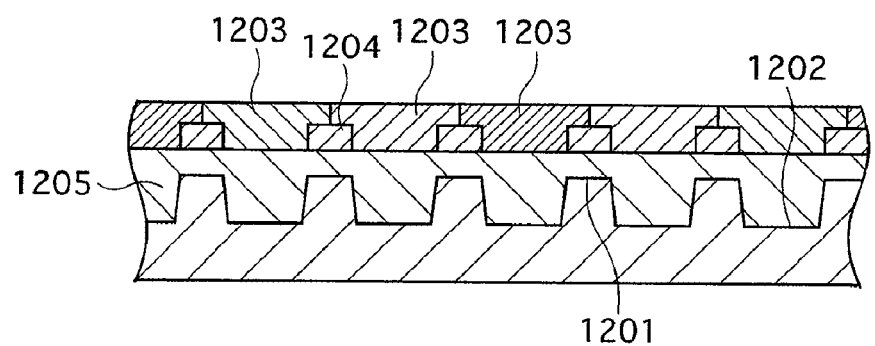
FIG. 2 is a cross-sectional view showing a structure of a solid-state imaging device according to another conventional technology.
Figure 3:
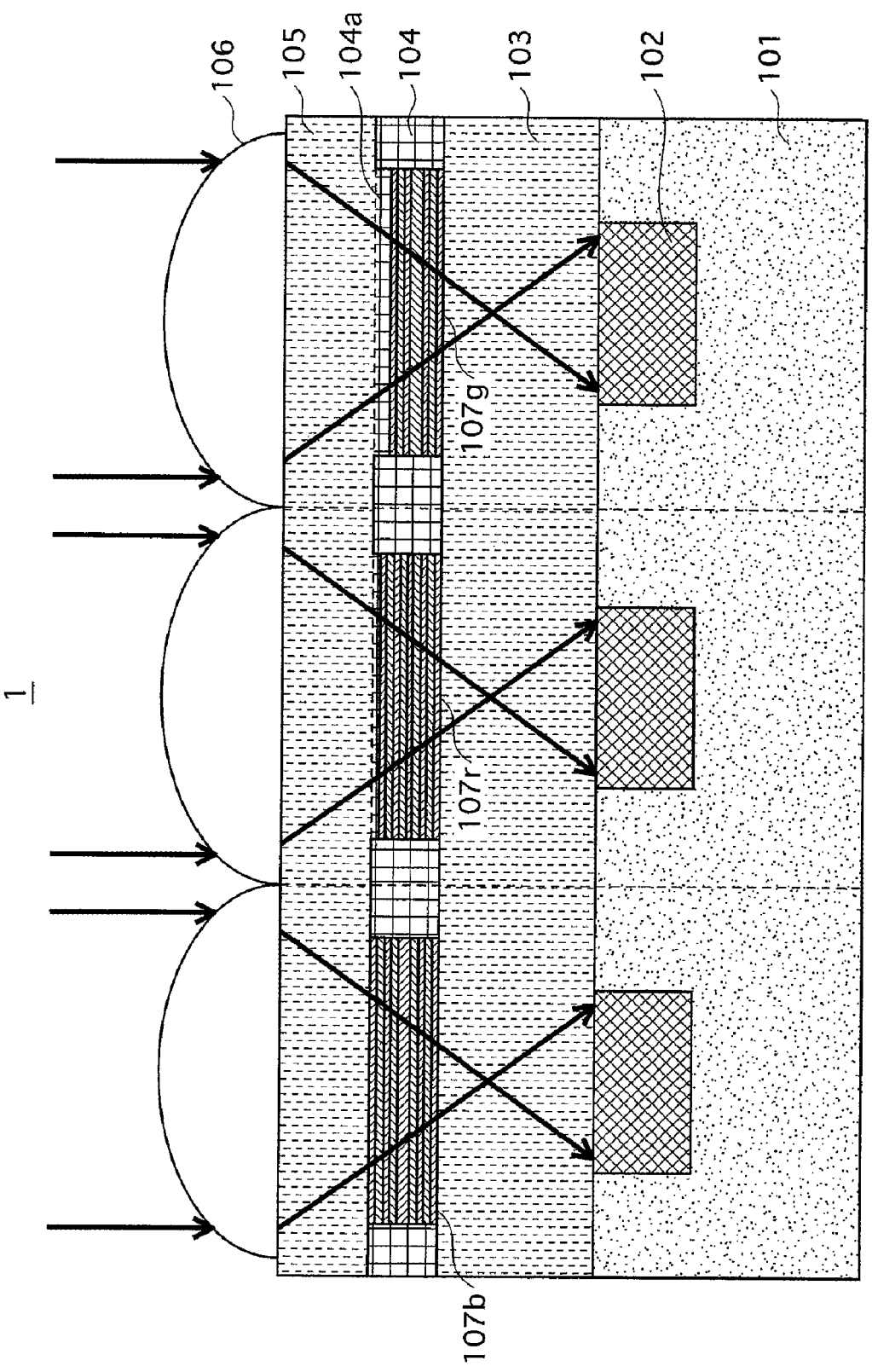
FIG. 3 is a cross-sectional view showing a portion of a structure of a solid-state imaging device according to embodiment 1 of the present invention.

The following first describes a structure of the solid-state imaging device pertaining to the present embodiment. FIG. 3 is a cross-sectional view showing a portion of a structure of the solid-state imaging device according to embodiment 1 of the present invention. As shown in FIG. 3, a solid-state imaging device 1 includes a semiconductor substrate 101, photoelectric converters 102, a planarizing layer 103, a light shielding layer 104, a planarizing layer 105 and condenser lenses 106.

The light shielding layer 104 has apertures 104a in which multilayer interference filters 107r, 107g and 107b are disposed.

The condenser lenses 106 focus incident light onto corresponding photoelectric converters 102. The multilayer interference filters 107r, 107g and 107b selectively transmit specific wavelength components of incident light. The light shielding film 104 prevents light transmitted by the condenser lenses 106 from being incident on non-corresponding photoelectric converter 102.

Each of the photoelectric converters 102 outputs an electrical signal according to a quantity of incident light. The planarizing layer 103 is composed of monosilicon dioxide and provides a flat upper surface for formation of the multilayer interference filters 107r, 107g and 107b. The planarizing layer 105 provides a flat upper surface for arrangement of the condenser lenses 106.

(2) Structure of the Multilayer Interference Filters 107r, 107g and 107b

Figure 4A:
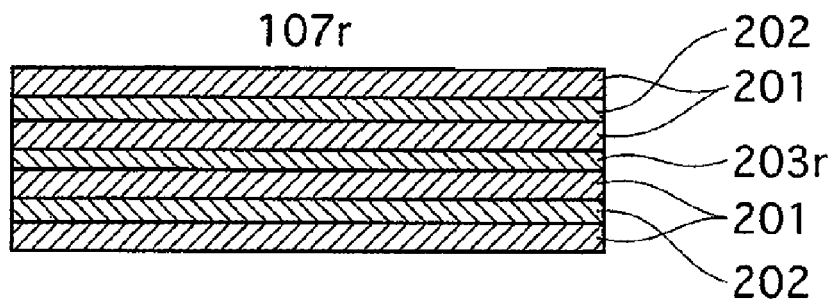
FIG. 4A shows the multilayer interference filter 107r.
Figure 4B:
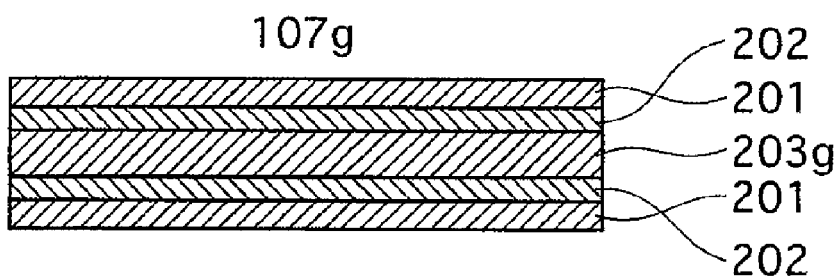
FIG. 4B shows the multilayer interference filter 107g.
Figure 4C:
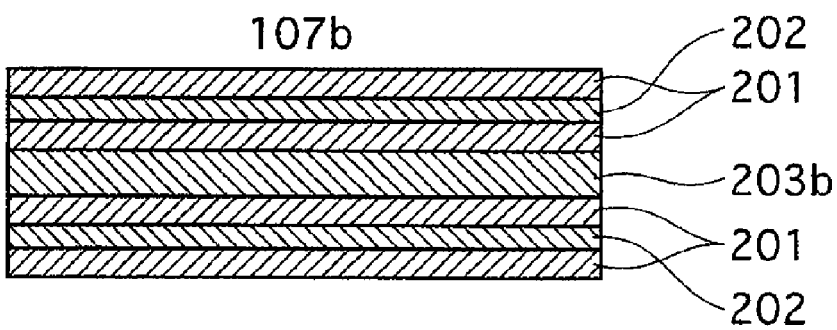
FIG. 4C shows the multilayer interference filter 107b.

FIG. 4 are cross-sectional views showing a layer structure of multilayer interference filters 107r, 107g and 107b according to embodiment 1, where FIG. 4A shows the multilayer interference filter 107r, FIG. 4B shows the multilayer interference filter 107g, and FIG. 4C shows the multilayer interference filter 107b.

As shown in FIG. 4A, the multilayer interference layer 107r has a structure in which monotitanium dioxide ($TiO_2$) layers 201 and monosilicon dioxide ($SiO_2$) layers 202 are alternately laminated, with a spacer layer 203r formed between the layers. The spacer layer 203r is composed of monosilicon dioxide, and is sandwiched between monotitanium dioxide layers 201.

The optical thicknesses of the monotitanium dioxide layers 201 and the monosilicon dioxide layers 202 are made the same. The optical thickness for one layer is obtained by multiplying the refractive index by the film thickness of the layer.

The multilayer interference filter 107b reflects light in a wavelength band (hereinafter, "reflection band") whose central wavelength is substantially equal to four times the optical thickness of the monotitanium dioxide layers 201 and the monosilicon dioxide layers 202, as well as transmits, from among the wavelengths included in the wavelength band, red light according to the optical thickness of the spacer layer 203r. In the present embodiment, the central wavelength is 530 nm, and the optical thickness of the spacer layer 203r is 45 nm.

As shown in FIG. 4B, the multilayer interference filter 107g also includes monotitanium dioxide layers 201, monosilicon dioxide layers 202 and a spacer layer 203g. Although the multilayer interference filter 107g has the same reflection band as that of the multilayer interference filter 107b, the spacer layer 203g composed of monotitanium dioxide has an optical thickness of 265 nm, thereby transmitting green light.

As shown in FIG. 4C, the multilayer interference filter 107b also has the same reflection band as that of the multilayer interference filters 107r and 107b, although the spacer layer 203b composed of monotitanium dioxide has an optical thickness of 190 nm, thereby transmitting blue light.

The multilayer interference filters 107r, 107g and 107b are composed of inorganic materials, and have total film thicknesses of 423 nm, 392 nm and 526 nm respectively.

Figure 5:
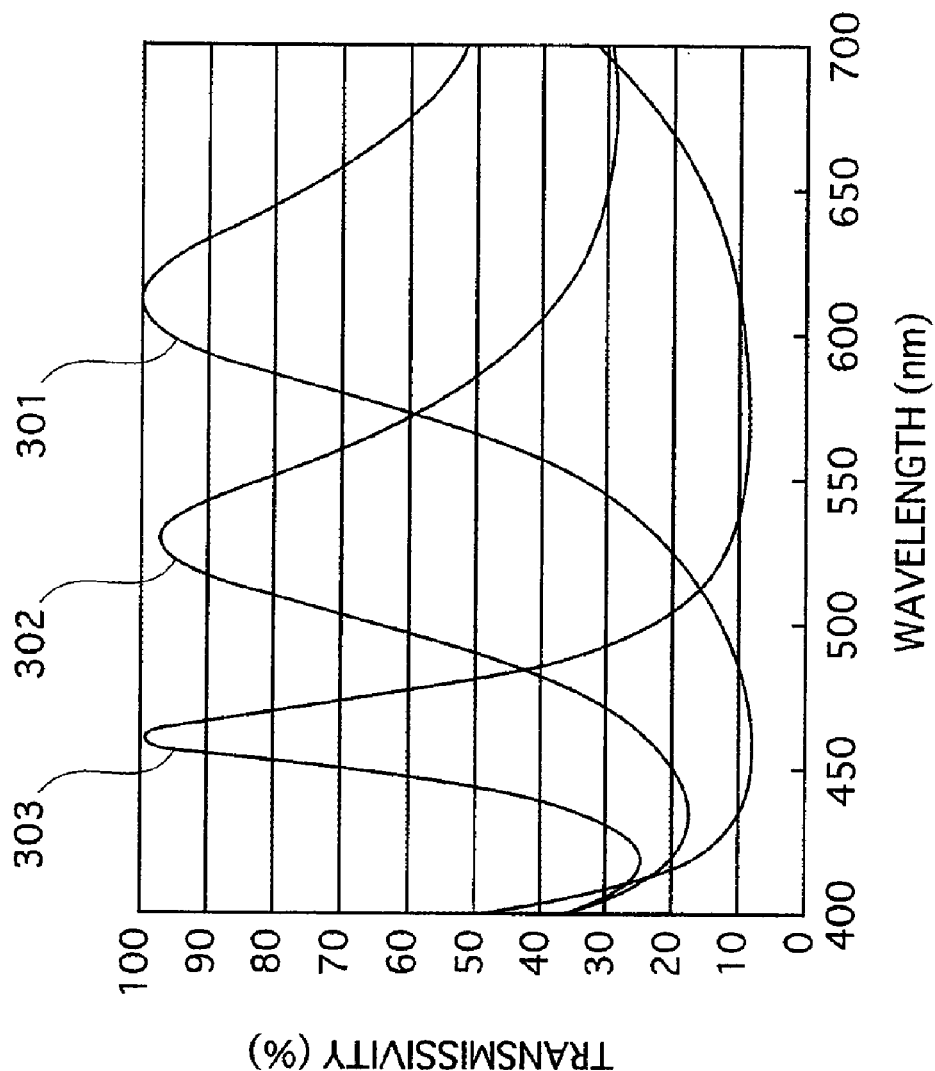
FIG. 5 is a graph showing spectral properties of the multilayer interference filters 107r, 107g and 107b according to embodiment 1 of the present invention.

FIG. 5 is a graph showing spectral properties of the multilayer interference filters 107r, 107g and 107b. Graphs 301 to 303 in FIG. 5 respectively show spectral properties of the multilayer interference filters 107r, 107g and 107b. As seen in the graphs, incident light is separated into the 3 primary colors red, green and blue in the present embodiment, which enables color images to be taken.

Note that a matrix method using the Fresnel coefficient for example, may be employed in designing the layer constitution and spectral properties of the multilayer interference filters.

(3) Dimensions of the Solid-State Imaging Device

Figure 6:
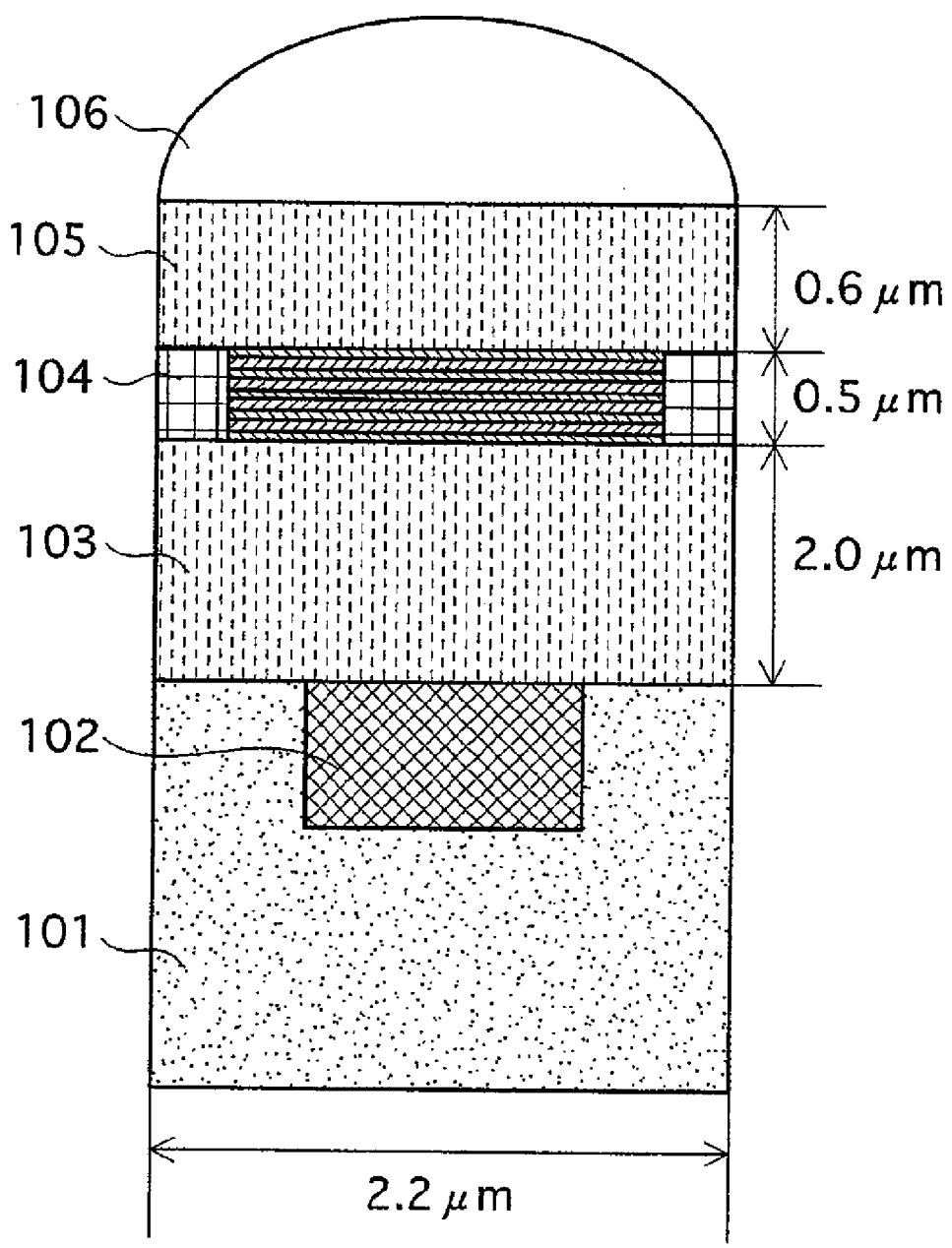
FIG. 6 shows dimensions of a solid-state imaging device 1 according to embodiment 1 of the present invention.

The following describes the dimensions of the solid-state imaging device 1. FIG. 6 shows dimensions of the solid-state imaging device 1. As shown in FIG. 6, the width of a single cell of the solid-state imaging device 1 is 2.2 μm. This width can be varied depending on the number of pixels in the solid-state imaging device 1. The planarizing layer 103, the light shielding film 104 and the planarizing layer 105 are respectively 2.0 μm, 0.5 μm and 0.6 μm in thickness. Consequently, the distance from the condenser lens 106 to the photoelectric converter 102 is 3.1 μm.

As previously mentioned, the film thicknesses of the color filters 1106 pertaining to conventional technology are from 1.5 μm to 2.0 μm. In contrast, the film thicknesses of the multilayer interference filters 107r, 107g and 107b are from 392 nm to 526 nm, which is a significant reduction. The present embodiment also allows the thickness of the solid-state imaging device itself to be reduced about 2 μm.

Given that the multilayer interference filters 107r, 107g and 107b pertaining to the present embodiment are composed of inorganic materials such as monotitanium dioxide and monosilicon dioxide, these multilayer interference filters can be formed in the apertures 104a of the light shielding film 104. According to this structure, it is possible to reduce the distance between the photoelectric converters 102 and the multilayer interference filters 107r, 107g and 107b, thereby enabling the prevention of color-mixing due to oblique light being incident on the photoelectric converters 102.

Given that the color filters 1106 of the solid-state imaging device 11 pertaining to the previously mentioned conventional technology are composed of an organic material, it is not possible to form the color filters 1106 and condenser lenses 1108 in the same process as the photoelectric converters 1102, the light shielding film 1104, wiring (not shown in the figure) and the like. In other words, it is necessary for the color filters 1106 and the condenser lenses 1102 to be formed separately after the photoelectric converters 1102 and the like have been formed. On the other hand, the color filters 107r, 107g and 107b according to the present embodiment are composed of inorganic materials, thereby allowing the color filters 107r, 107g and 107b to be formed in the same process as the photoelectric converters 102 and the like. Consequently, it is possible to realize high productivity and a reduction in cost.

(4) Manufacturing Method of the Solid-State Imaging Device 1

The following describes the manufacturing method of the solid-state imaging device 1, and in particular a manufacturing method of the multilayer interference filters 107r, 107g and 107b, and the light shielding film 104 which are formed on the planarizing layer 103. FIG. 7 are cross-sectional views showing processes for manufacturing the solid-state imaging device 1. FIG. 8 show processes continuing from FIG. 7.

Figure 7A:
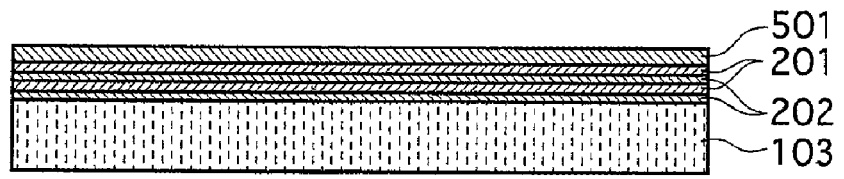
FIG. 7 are cross-sectional views showing processes for manufacturing the solid-state imaging device 1 according to embodiment 1 of the present invention.

As shown in FIG. 7A, monosilicon dioxide layers 202 and monotitanium dioxide layers 201 are alternately laminated on the planarizing layer 103 using an RF (radio frequency) sputtering device. Next, a monosilicon dioxide layer 501 is formed on the top monotitanium dioxide layer 201. The monosilicon dioxide layer 501 has an optical thickness of 150 nm.

A resist 502 is formed by applying a resist agent onto the monosilicon dioxide layer 501, heat treating the applied resist agent (prebake), exposing the resist agent using a photolithography device such as a stepper, developing the resist with an organic solvent or the like, and heat treating the developed resist (postbake). The resist 502 has a thickness of 1 μm.

Figure 7B:
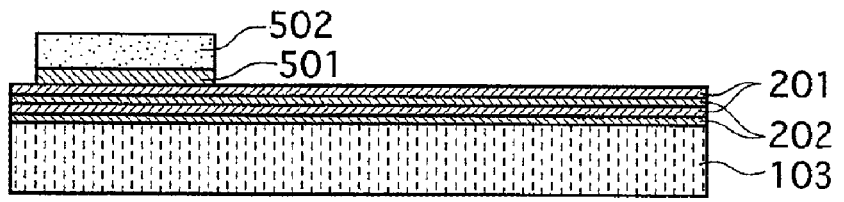
Figure 7C:
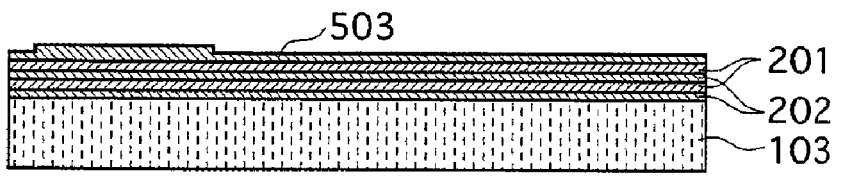

As shown in FIG. 7B, the monosilicon dioxide layer is removed by dry etching, except for a blue pixel region which is excluded using the resist 502. Conditions for etching are as follows: the etching gas is monocarbon tetrafluoride ($CF_4$), the gas flow rate is 40 sccm, the RF power is 200 W, and the degree of vacuum is 0.050 Torr.

Note that the monosilicon dioxide layer may be removed by a wet etching process using hydrofluoric acid since monohydrogen monofluoride has high selectivity over monosilicon dioxide and monotitanium dioxide.

In this case, the hydrofluoric acid should be a mixture of hydrofluoric acid and an ammonium fluoride solution in a ratio of 1 to 4. The monosilicon dioxide layer 501 can be etched by immersion in the above mixed solution for approximately 5 seconds.

After etching is finished, an organic solvent or the like is used to remove the resist 502 (FIG. 7C), and a monosilicon dioxide layer 503 is formed using the RF sputtering device. The newly formed monosilicon dioxide layer 503 has an optical thickness of 45 nm.

In the area where the monosilicon dioxide layer 501 remains as a result of etching, the combined optical thickness of the previously formed monosilicon dioxide layer 501 and the newly formed monosilicon dioxide layer 503 is 195 nm.

Figure 7D:
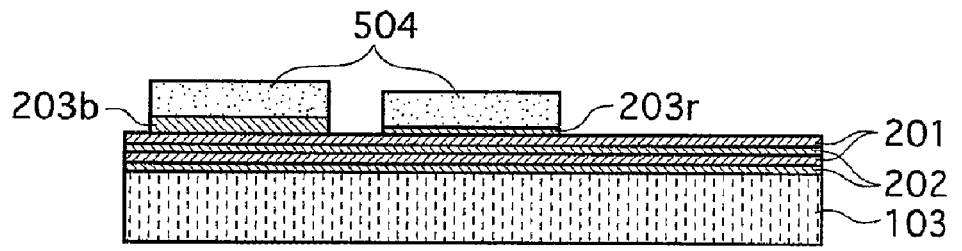

Next, resists 504 are formed at a blue region and a red region in a process similar to the formation of the resist 502 (FIG. 7D). Areas of the monosilicon dioxide layer 503 not covered by the resists 504 are then removed by an etching process.

As a result, a spacer layer 203b with an optical thickness of 195 nm is formed in the blue region, and a spacer layer 203r with an optical thickness of 45 nm is formed in the red region. A spacer layer using monosilicon dioxide is not formed in the green region.

Figure 7E:
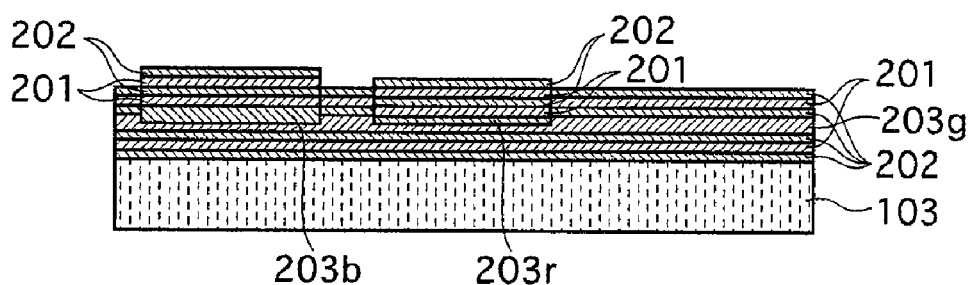

Furthermore, the RF sputtering device is used to laminate a monotitanium dioxide layer 201, a monosilicon dioxide layer 202, a further monotitanium dioxide layer 201 and a further monosilicon dioxide layer 202 on the monotitanium dioxide layer 201 and the spacer layers 203b and 203r (FIG. 7E).

As a result, a spacer layer 203g using monotitanium dioxide is formed in the green region. The spacer layer 203g has an optical thickness of 265 nm, which is equivalent to two times the optical thickness of the monotitanium dioxide layer 201.

Next, a light shielding film 104 for blocking oblique light is formed. Resists 601 are formed by applying a resist agent onto the monosilicon dioxide layer 202, heat treating the applied resist agent (prebake), exposing the resist agent using a photolithography device such as a stepper, developing the resists with an organic solvent or the like, and heat treating the developed resists (postbake). The resists 601 have a thickness of 2.5 μm.

Figure 8A:
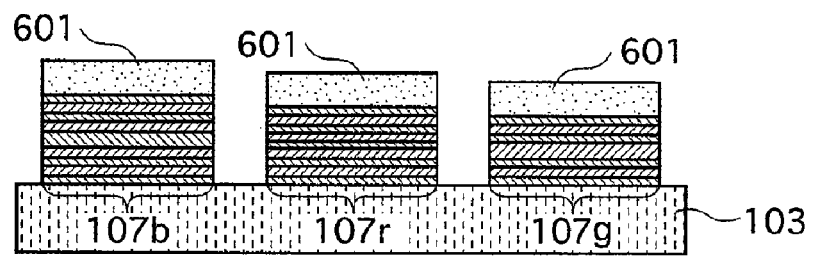
FIG. 8 are cross-sectional views showing manufacturing processes of the solid-state imaging device 1, continuing from FIG. 7, according to embodiment 1 of the present invention.

The multilayer interference filter is then removed, by dry etching, in regions where the light shielding film 104 is to be formed, thereby resulting in the formation of the multilayer interference filters 107r, 107g and 107b, and grooves where the light shielding film 104 is to be formed (FIG. 8A). An organic solvent is then used to remove the resists 601.

Figure 8B:
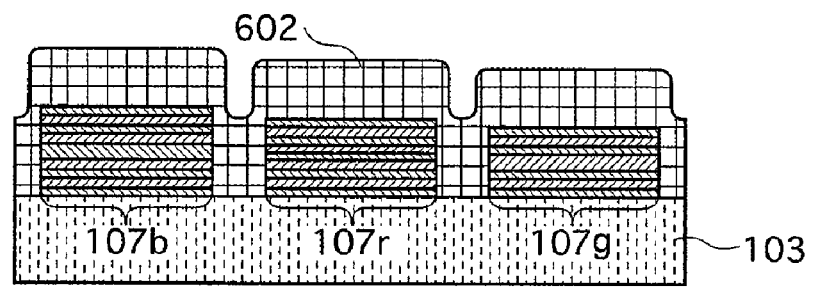

Next, an aluminum layer 602 is formed on the monosilicon dioxide layer 202 and the planarizing layer 103 (FIG. 8B). The aluminum layer 602 has a thickness of 600 nm, which is roughly equal to the thicknesses of the multilayer interference filters 107r, 107g and 107b. The aluminum layer 602 includes portions which are to be the light shielding film 104.

Figure 8C:
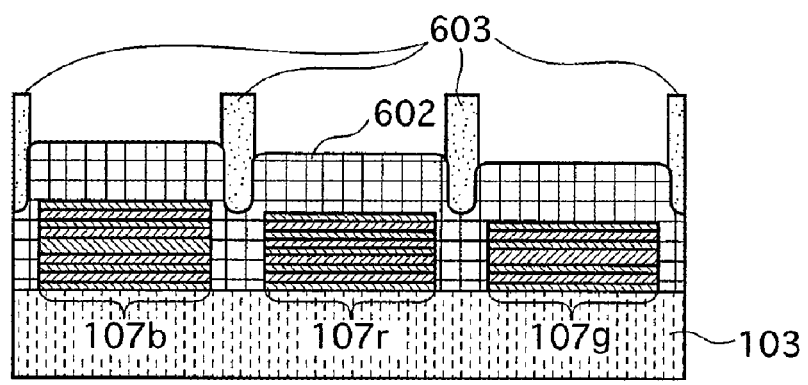
Figure 8D:
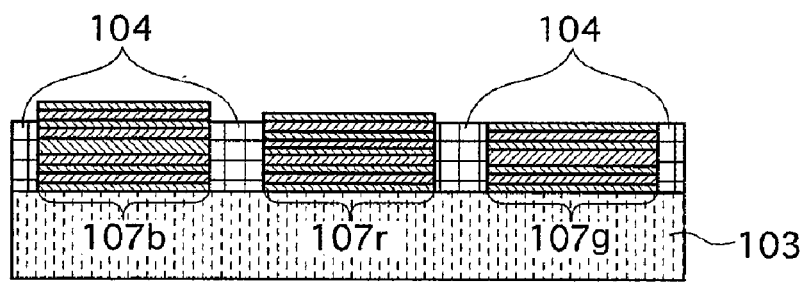

Resists 603 are then formed on the aluminum layer 602 (FIG. 8C). The resists 603 are formed by applying a resist agent onto the aluminum layer 602, heat treating the applied resist agent (prebake), exposing the resist agent using a photolithography device such as a stepper, developing the resists with an organic solvent or the like, and heat treating the developed resists (postbake).

Next, a chlorinated etching gas is used in an etching process to remove the aluminum layer 602 on the multilayer interference filters 107r, 107g and 107b. The resists 603 are removed using an organic solvent or the like (FIG. 8D), thereby resulting in the formation of the light shielding film 104.

As mentioned above, in the present embodiment the light shielding film 104 is formed after the formation of the multilayer interference filters 107r, 107g and 107b. However, a manufacturing method in which the multilayer interference filters are formed after the light shielding film is also conceivable.

Figure 9:
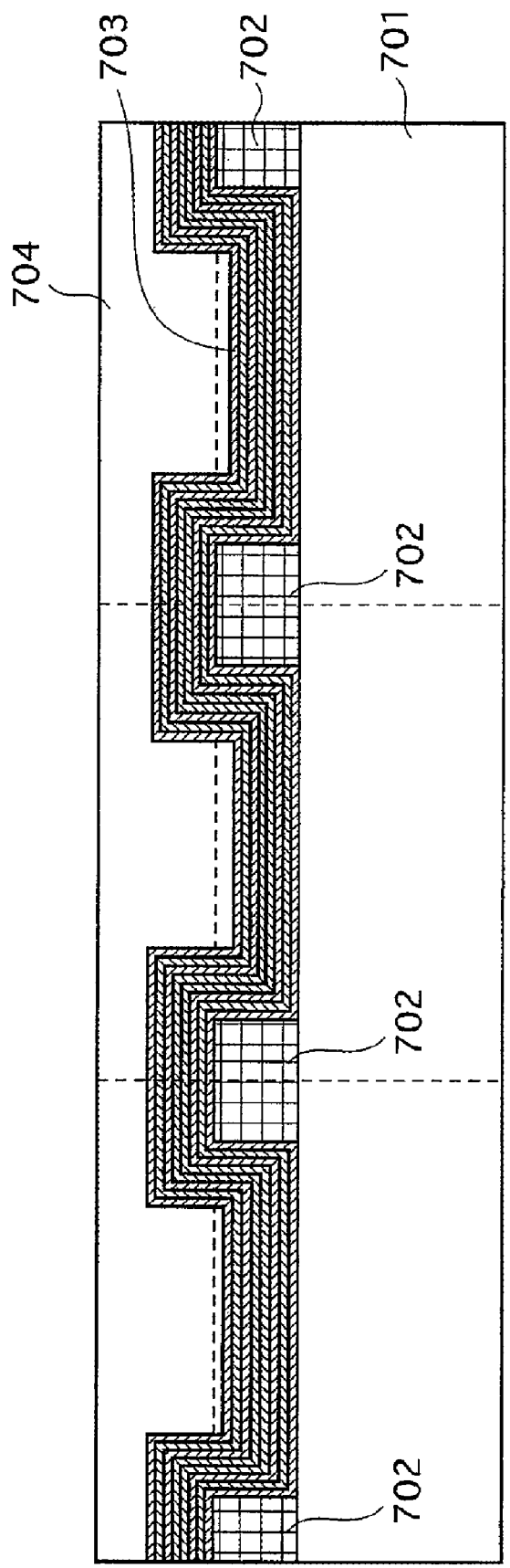
FIG. 9 is a cross-sectional view showing a constitution of a multilayer interference filter manufactured by formation after a light shielding film has been formed.

FIG. 9 is a cross-sectional view showing a constitution of a multilayer interference filter manufactured by formation after a light shielding film has been formed. When this manufacturing method is adopted as shown in FIG. 9, portions of the multilayer interference filter 703 which are in contact with the light shielding film 702 are formed following the contour of the light shielding film 702.

On the other hand, the multilayer interference filters only function to separate colors in the laminate direction. For this reason, there is a reduction in the color separation function in portions that rise up along edges of the apertures in the light shielding film 702. This reduction of color separation function becomes more marked as the thickness of the multilayer interference filters increases compared with the area of the apertures, which runs contrary to the demand for miniaturization and an increase in pixels. The manufacturing method pertaining to the present invention is effective in this context as well.

(5) Variations

The present invention has been described based on the embodiment, although the present invention is certainly not limited to the above-mentioned embodiment. The following variations can also be practiced.

(1) In the above embodiment, only one manufacturing method of the solid-state imaging device pertaining to the present invention is described, although, needless to say, the present invention is not limited as such. Alternatively, the manufacturing method may be as follows.

Figure 10A:
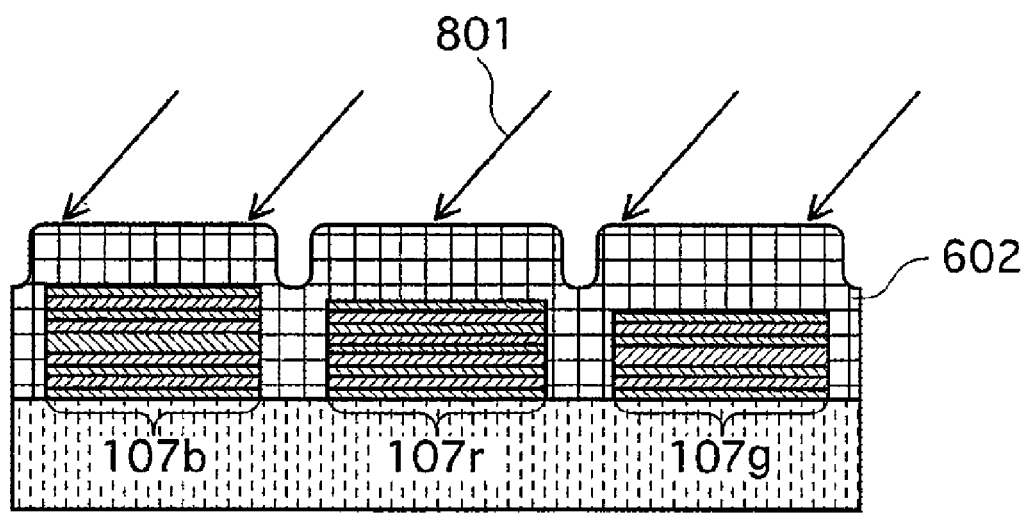
FIG. 10 are cross-sectional views showing manufacturing processes of a solid-state imaging device according to variation 1 of the present invention.
Figure 10B:
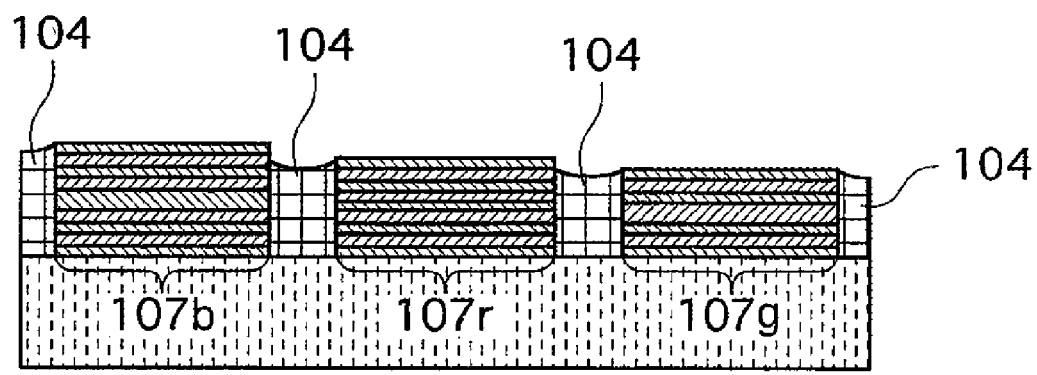

FIG. 10 are cross-sectional views showing manufacturing processes of a solid-state imaging device according to variation 1. Variation 1 is the same as described in the above embodiment up to FIGS. 7 and 8B. After forming an aluminum layer 602, oblique etching relative to a wafer surface is performed as shown by an arrow 801 in FIG. 10.

This type of etching enables the removal of unnecessary portions of the aluminum layer 602, while leaving the aluminum layer 602 in the grooves sandwiched between the multilayer interference filters.

Consequently, it is possible to form the light shielding film 104 without using resists, thereby simplifying the manufacturing process of the solid-state imaging device 1 and enabling a reduction in manufacturing cost.

(2) The above embodiment describes a case in which the planarizing layer is formed on all the multilayer interference filters, although, needless to say, the present invention is not limited as such. Alternatively, the present invention may be as follows.

FIG. 11 are cross-sectional views showing manufacturing processes of a solid-state imaging device according to variation 2. Note that the processes described in FIG. 7 are the same in this case, and their description has thus been omitted. After forming the multilayer interference filters composed of monosilicon dioxide layers 902, monotitanium dioxide layers 901, and spacer layers 903r, 903g and 903b, a monosilicon dioxide layer 905 is formed using the RF sputtering device (FIG. 11A).

Figure 11A:
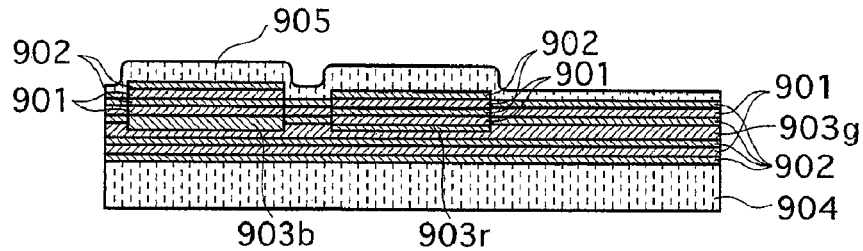
FIG. 11 are cross-sectional views showing manufacturing processes of a solid-state imaging device according to variation 2 of the present invention.
Figure 11B:
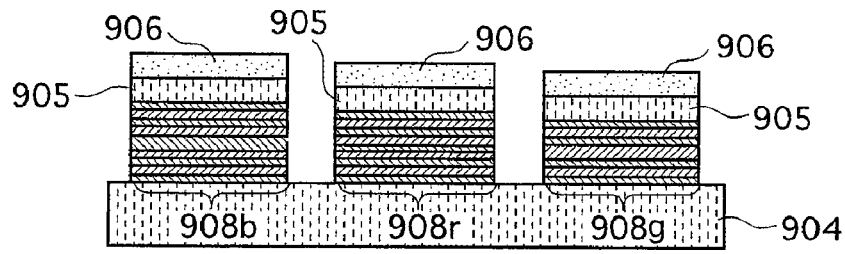

This monosilicon dioxide layer 905 has an optical thickness of 195 nm. Resists 906 are further formed on the monosilicon dioxide layer 905 in regions where the light shielding film will not be formed. Next, grooves are formed between multilayer interference filters 908r, 908g and 908b using an etching process (FIG. 11B). The resists 906 are then removed using an organic solvent or the like.

Figure 11C:
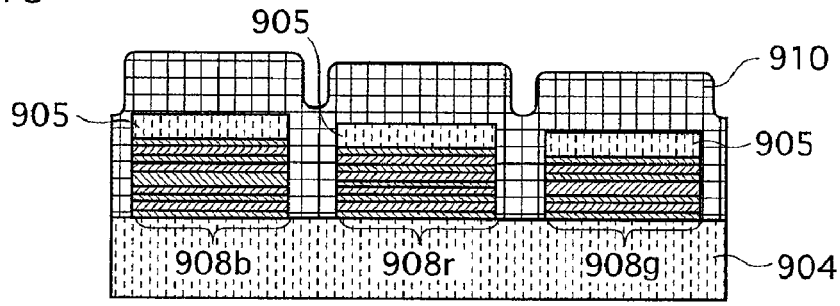

Next, a tungsten layer 910 is formed on the monosilicon dioxide layer 905 and the planarizing layer 904 using a CVD (Chemical Vapor Deposition) method. The tungsten layer 910 has a thickness of 600 nm (FIG. 11C).

Figure 11D:
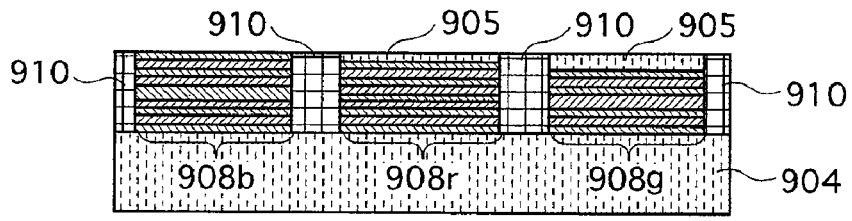
Figure 11E:
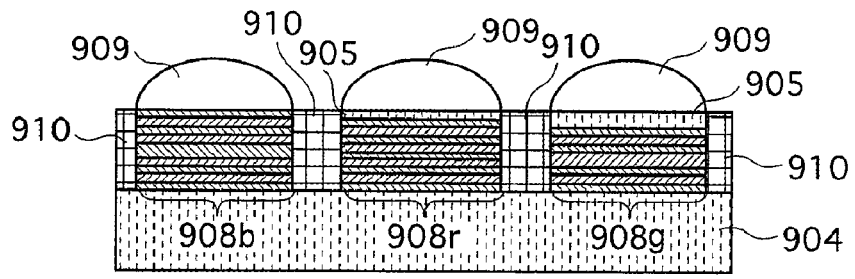

The tungsten layer 910 and the monosilicon dioxide layer 905 are polished using, for example, a CMP method (FIG. 11D). Upper portions of the multilayer interference filters 908r, 908g and 908b are planarized as a result, and formation of the light shielding film is completed.

Lastly, the solid-state imaging device is completed by fitting condenser lenses 909 on the multilayer interference filter 908b and the tungsten layer 910.

According to this structure, the light shielding film can be formed using only the CMP method without undergoing an etching process. The manufacturing process of the solid-state imaging device can also be simplified since the upper surface of the solid-state imaging device is planarized at the same time as the light shielding film is formed.

(3) The above embodiment describes a case in which the multilayer interference filters have five layers or seven layers, although, needless to say, the present invention is not limited as such. Alternatively, the multilayer interference filters may have four or less layers, six layers, or eight or more layers.

In the above embodiment, the number of layers in the multilayer films which sandwich the spacer layers is identical (vertically symmetric), although this is not a requirement. It is possible to obtain the effects of the present invention regardless of the number of layers in the multilayer interference filters.

(4) The above embodiment describes a case in which the materials composing the multilayer interference filters are monosilicon dioxide and monotitanium dioxide, although, needless to say, the present invention is not limited as such. Alternatively, ditantalum pentoxide ($Ta_2O_5$), monozirconium dioxide ($ZrO_2$), monosilicon mononitride (SiN), trisilicon tetranitride ($Si_3N_4$), dialuminum trioxide ($Al_2O_3$), monomagnesium difluoride ($MgF_2$), monohafnium trioxide ($HfO_3$) or monomagnesium dioxide ($MgO_2$) may be used.

Irrespective of the material used, the present invention has the same effects of suppressing color-mixing that comes with miniaturization of solid-state imaging devices and suppressing the reduction of the color separation function.

(5) The above embodiment describes a case in which multilayer interference filters are used as color filters, although, needless to say, the present invention is not limited as such. Alternatively, single-layer filters may be used.

Figure 12:
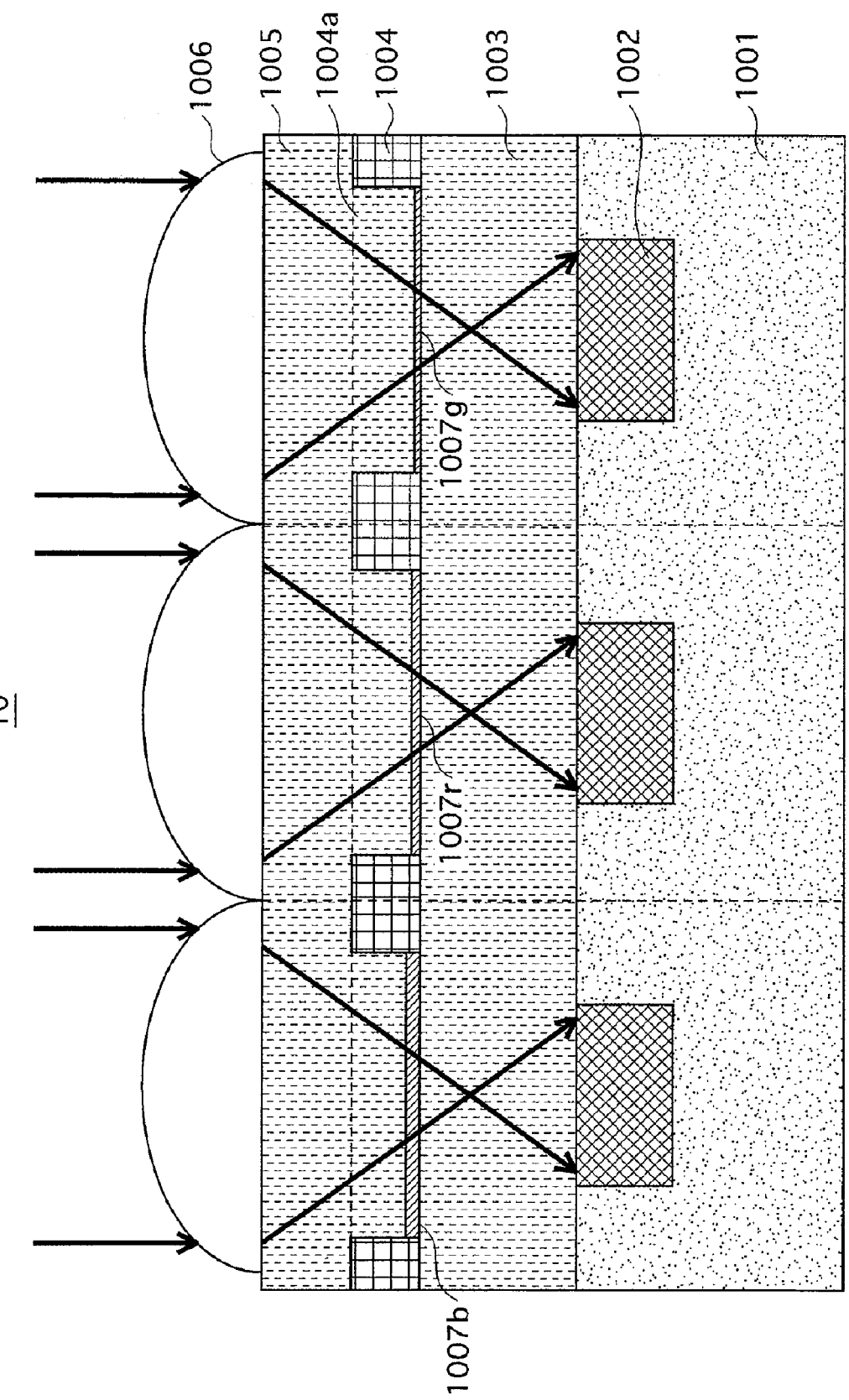
FIG. 12 is a cross-sectional view showing a portion of a structure of a solid-state imaging device according to variation 5 of the present invention.

FIG. 12 is a cross-sectional view showing a portion of a structure of a solid-state imaging device according to variation 5. As shown in FIG. 12, a solid-state imaging device 10 includes a semiconductor substrate 1001, photoelectric converters 1002, a planarizing layer 1003, a light shielding film 1004, a planarizing layer 1005 and condenser lenses 1006. The light shielding film 1004 has apertures 1004a in which single-layer filters 1007r, 1007g and 1007b are disposed.

The condenser lenses 1006 focus incident light onto corresponding photoelectric converters 1002. The multilayer interference filters 1007r, 1007g and 1007b selectively transmit only specific wavelength components of the incident light. The light shielding film 1004 prevents light transmitted by the condenser lenses 1006 from being incident on non-corresponding photoelectric converters 1002.

Each of the photoelectric converters 1002 outputs an electrical signal according to a quantity of incident light. The planarizing layer 1003 is composed of monosilicon dioxide and provides a flat upper surface for formation of the single-layer filters 1007r, 1007g and 1007b. The planarizing layer 1005 provides a flat upper surface for arrangement of the condenser lens 1006.

Here, the single-layer filters 1007r, 1007g and 1007b are composed of amorphous silicon. The single-layer filters 1007r, 1007g and 1007b have respective film thicknesses d of 70 nm, 55 nm and 40 nm. Amorphous silicon has a refractive index n of 4.5, 4.75 and 5.0 in relation to 650 nm, 530 nm and 470 nm wavelength light, whereby the following equation expresses a relation between the wavelength $\lambda$, at which the transmissivity of the single-layer filters is maximized, and the refractive index and film thickness of the single-layer filters.

$$\frac{\lambda}{2} = nd$$

Consequently, the single-layer filter 1007r has spectral properties in which transmissivity is maximized at a wavelength of 650 nm. The transmissivities of the single-layer filters 1007g and 1007b are maximized at wavelengths of 530 nm and 470 nm respectively.

Generally, with a medium of a given film thickness, a reinforcing wavelength and weakening wavelength are determined according to the film thickness as a result of reflection between the film and an external medium, thereby generating interference. Amorphous silicon can be called an absorbent material due to having a large extinction coefficient of from 0 to 2 at wavelengths from 400 nm to 700 nm. Amorphous silicon thus absorbs light in a specific wavelength region.

Consequently, given that amorphous silicon transmits light of different wavelength regions depending on the film thickness, amorphous silicon can be made into color filters by varying the film thickness per light receiving cell. It is thus possible to gain the effects of the present invention even if single-layer filters are used instead of multilayer interference filters.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid-state imaging device comprising:
   a color filter that is composed of an inorganic material and configured to transmit a specific wavelength component of incident light;
   a light shielding film configured to shield incident light; and
   a photoelectric converter configured to generate an electrical signal according to a quantity of light transmitted by the color filter, wherein
   the light shielding film has an aperture at a position opposing the photoelectric converter,
   the color filter is disposed in the aperture of the light shielding film,
   a film thickness of the color filter is less than or equal to a film thickness of the light shielding film,
   the color filter is a multilayer interference filter,
   the multilayer interference filter is composed of a pair of $\lambda/4$ multilayer films and a spacer layer sandwiched therebetween, each multilayer film being constituted from two types of alternately laminated dielectric layers that are of different materials and have a same optical thickness, and the spacer layer having a different optical thickness from the dielectric layers constituting the $\lambda/4$ multilayer films, and
   the dielectric layers that constitute the $\lambda/4$ multilayer films consist of two materials selected from the group consisting of monosilicon dioxide, monotitanium dioxide, ditantalum pentoxide, monozirconium dioxide, monosilicon mononitride, trisilicon tetranitride, dialuminum trioxide, monomagnesium difluoride, monohafnium trioxide and monomagnesium dioxide.

2. The solid-state imaging device of claim 1, wherein the dielectric layers that constitute the $\lambda/4$ multilayer films consist of monosilicon dioxide and monotitanium dioxide.

\* \* \* \* \*